United States Patent
Weber

(10) Patent No.: US 11,585,877 B2
(45) Date of Patent: Feb. 21, 2023

(54) MAGNETIC RESONANCE APPARATUS WITH A PATIENT POSITIONING APPARATUS AND A COMMUNICATION UNIT

(71) Applicant: Siemens Healthcare GmbH, Erlangen (DE)

(72) Inventor: Hans Weber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/468,998

(22) Filed: Sep. 8, 2021

(65) Prior Publication Data
US 2022/0075012 A1    Mar. 10, 2022

(30) Foreign Application Priority Data
Sep. 8, 2020    (DE) .................... 102020211274.6

(51) Int. Cl.
*G01R 33/30* (2006.01)
*G01R 33/34* (2006.01)
*G01R 33/54* (2006.01)

(52) U.S. Cl.
CPC ..... *G01R 33/307* (2013.01); *G01R 33/34084* (2013.01); *G01R 33/546* (2013.01)

(58) Field of Classification Search
CPC ............ G01R 33/307; G01R 33/34084; G01R 33/546; G01R 33/36; G01R 33/283; A61B 5/055; A61B 5/704
See application file for complete search history.

(56) References Cited

U.S. PATENT DOCUMENTS

| | | |
|---|---|---|
| 2007/0066885 A1 | 3/2007 | Vaughan |
| 2008/0141461 A1* | 6/2008 | Feld ........................ A61B 5/055 5/601 |
| 2013/0181716 A1* | 7/2013 | Greim .................. G01R 33/422 324/322 |
| 2015/0226816 A1* | 8/2015 | Matschl ................. A61B 5/055 600/418 |
| 2017/0336484 A1* | 11/2017 | Fuderer .............. G01R 33/3692 |
| 2019/0377042 A1 | 12/2019 | Anderson et al. |

FOREIGN PATENT DOCUMENTS

| | | |
|---|---|---|
| DE | 102014202301 A1 | 8/2015 |
| WO | 2018094538 A1 | 5/2018 |
| WO | 2018205031 A1 | 11/2018 |
| WO | 2019068185 A1 | 4/2019 |
| WO | 2021102587 A1 | 6/2021 |

OTHER PUBLICATIONS

Innovere Medical, Innovision—Redefining the MRI experience, 2019, available: https://innoveremedical.com/, accessed: Mar. 21, 2020.
German action dated Jul. 8, 2021, Application No. 10 2020 211 274.6.

* cited by examiner

*Primary Examiner* — G. M. A Hyder
(74) *Attorney, Agent, or Firm* — Banner & Witcoff Ltd.

(57) ABSTRACT

The disclosure relates to a magnetic resonance apparatus with a patient positioning apparatus comprising at least one coil plug-in element and a communication unit, wherein the magnetic resonance apparatus comprises an adapter apparatus with a communication interface and the adapter apparatus is adapted to couple the communication unit to the at least one coil plug-in element of the patient positioning apparatus.

18 Claims, 2 Drawing Sheets

Figure 1:
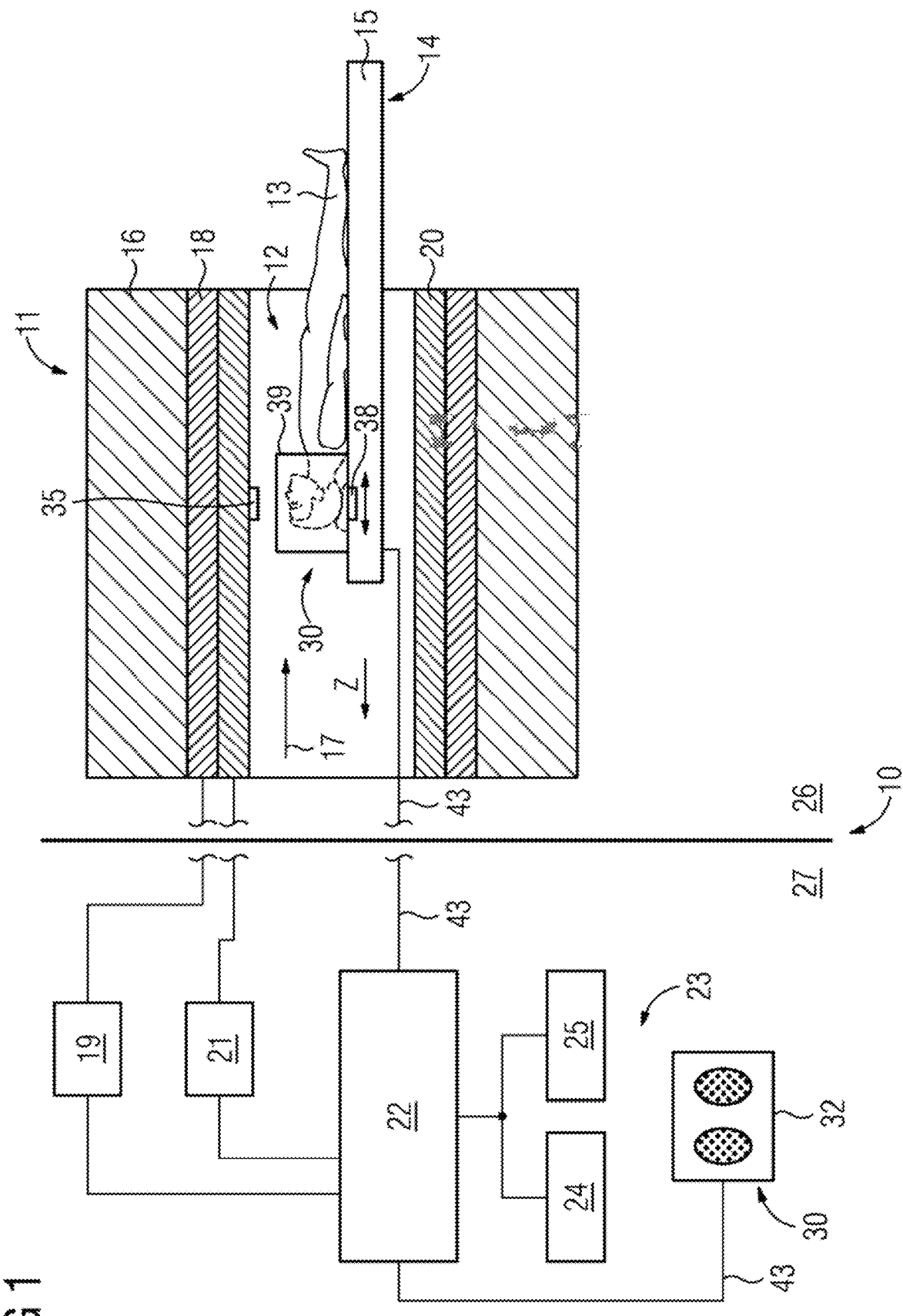

MAGNETIC RESONANCE APPARATUS WITH A PATIENT POSITIONING APPARATUS AND A COMMUNICATION UNIT

CROSS-REFERENCE TO RELATED APPLICATIONS

The present application claims the benefit of the filing date of Germany patent application no. DE 10 2020 211 274.6, filed on Sep. 8, 2020, the contents of which are incorporated herein by reference in their entirety.

TECHNICAL FIELD

The disclosure relates to relates to a magnetic resonance apparatus with a patient positioning apparatus and a communication unit.

BACKGROUND

Magnetic resonance examinations are frequently perceived as unpleasant by patients. Reasons for this are, for example, a relatively long examination time that the patient has to spend within a patient receiving area of the magnetic resonance apparatus during the magnetic resonance examination. Herein, the examination time can be up to one hour. Moreover, during the long duration of the magnetic resonance examination, the patient should remain as motionless as possible to avoid repeated scans and/or image artifacts. Another reason why patients frequently perceive magnetic resonance examinations as unpleasant is that there is very loud noise exposure from the magnetic resonance apparatus, in particular a gradient coil unit of the magnetic resonance apparatus, during the magnetic resonance examination.

In order to make the stay during the magnetic resonance examination within the patient receiving area of the magnetic resonance apparatus as pleasant as possible for the patient, the availability of patient entertainment with music for patients during the magnetic resonance examination is known. Such patient entertainment in particular contributes to distracting and/or calming the patient during the magnetic resonance examination.

For example, headphones are available to the patient for audio output, in particular for audio output and/or to entertain the patient with music during the magnetic resonance examination. To avoid interference with magnetic resonance data acquisition during the transmission of audio signals during the magnetic resonance examination, it is common for the headphones provided and the signal transmission of audio signals and/or audio data to be embodied as magnetic resonance compatible. For the signal transmission, it is known to date to use a sound tube and sound headphones for the audio output. However, such sound tubes and sound headphones frequently have inadequate transmission quality and/or signal quality for effectively distracting the patient from the magnetic resonance examination.

A further option for patient entertainment is a patient entertainment system that includes a display and headphones. If a magnetic resonance head coil is used for the magnetic resonance examination on the patient, the display can be placed over the head coil with a frame so that the patient can look directly at the display during the magnetic resonance examination. However, such a patient entertainment system entails very high costs. Furthermore, for patient entertainment and/or patient communication, the display and headphones have to be actuated via radio. Moreover, the display and the headphones also have to be regularly supplied with batteries for a power supply, which in turn entails a high degree of maintenance.

SUMMARY

The present disclosure is based on the object of providing simple and inexpensive patient entertainment with high signal quality. The object is achieved by the features of the embodiments as discussed herein, as well as in the claims.

The disclosure is based on a magnetic resonance apparatus with a patient positioning apparatus comprising at least one coil plug-in element and a communication unit. According to the disclosure, the magnetic resonance apparatus comprises an adapter apparatus with a communication interface, wherein the adapter apparatus is adapted to couple the communication unit to the at least one coil plug-in element of the patient positioning apparatus.

The magnetic resonance apparatus may include a medical and/or diagnostic magnetic resonance apparatus adapted and/or embodied to acquire medical and/or diagnostic image data, in particular medical and/or diagnostic magnetic resonance image data, of a patient. The magnetic resonance apparatus may include a scanner unit, e.g. a magnet unit, for acquiring the medical and/or diagnostic image data. Here, the scanner unit, e.g. the magnet unit, includes a main magnet, a gradient coil unit and a radio-frequency antenna unit. Here, the radio-frequency antenna unit is fixed inside the scanner unit. To acquire magnetic resonance signals, the magnetic resonance coil is arranged around the area of the patient to be examined.

For a magnetic resonance examination, the patient, e.g. the area of the patient to be examined, is positioned within a patient receiving area of the magnetic resonance apparatus. Herein, the patient receiving area is at least partially surrounded by the scanner unit, e.g. surrounded in a cylindrical shape. A field of view (FOV) and/or an isocenter of the magnetic resonance apparatus may be arranged within the patient receiving area. The FOV may include an acquisition area of the magnetic resonance apparatus within which the conditions for the acquisition of medical image data, e.g. magnetic resonance image data, are present within the patient receiving area, such as, for example, a homogeneous main magnetic field. The isocenter of the magnetic resonance apparatus may include the area and/or point within the magnetic resonance apparatus with the optimal and/or ideal conditions for the acquisition of medical image data. For instance, the isocenter includes the most homogeneous magnetic field area within the magnetic resonance apparatus.

The patient positioning apparatus is embodied for the positioning of the patient. The patient positioning apparatus may include a movable patient table in particular embodied to be movable within a patient receiving area of the magnetic resonance apparatus. The patient is moved together with the patient table into the patient receiving area for a magnetic resonance examination.

The coil plug-in element may include a plug socket arranged on the patient positioning apparatus. The coil plug-in element of the patient positioning apparatus may be included in a plug interface, wherein the plug interface includes a second coil plug-in element, e.g. a plug, on a magnetic resonance coil and/or the adapter apparatus. The plug interface is used for data transmission, e.g. the transmission of magnetic resonance data, from the magnetic resonance coil to an evaluation unit during a magnetic resonance examination with the on the magnetic resonance coil. Moreover, the plug interface can also be used to actuate the magnetic resonance coil by a control unit and herein to transmit control data from the control unit to the magnetic resonance coil. The plug interface, e.g. the at least one coil plug-in element, may be adapted and/or embodied to transmit communication signals from the communication unit.

The communication unit may be adapted and/or implemented to enable communication between a medical operator and the patient and/or to entertain the patient during the magnetic resonance examination. The communication unit may be adapted and/or implemented to exchange acoustic communication data and/or audio data with the patient. During communication between the medical operator and the patient, the patient can receive instructions from the medical operator during the magnetic resonance examination regarding the patient's behavior during the magnetic resonance examination. For example, the patient can receive instructions regarding how to breathe correctly and/or the correct position to adopt etc. from the medical operator. Moreover, the patient can also be given information about the examination. For patient entertainment during the magnetic resonance examination and/or during the patient's stay within a patient receiving area of the magnetic resonance apparatus, the communication unit may provide the patient with an entertainment program from which to choose. For instance, herein the patient can use the communication unit to select from a music entertainment program.

For patient entertainment and/or for outputting information to the patient, the communication unit may comprise an output element adapted and/or implemented to output communication signals and/or communication data to the patient. The output element of the communication unit can, for example, include an output element for outputting audio signals and/or acoustic communication signals and/or communication data, such as, for example, headphones and/or loudspeakers of the communication unit. The output element of the communication unit may be coupled to the patient positioning apparatus by means of the adapter unit.

Herein, the communication unit can include an audio cushion with which the output elements of the communication unit are integrated into the audio cushion. In this way, the communication unit can be arranged in the vicinity of the patient's head, e.g. the patient's ears, thus also ensuring that communication data and/or communication signals can be acquired in a good and effective manner for the patient.

Furthermore, the patient can also inform the medical operator of how he or she is feeling during the magnetic resonance examination and/or during time spent within a patient receiving area of the magnetic resonance apparatus by means of the communication unit. For this purpose, the communication unit can include an input element adapted and/or implemented to enable the patient to input communication signals and/or communication data. The input element of the communication unit can, for example, include an input element for inputting audio signals and/or acoustic communication signals and/or communication data, such as, for example, a microphone of the communication unit. Moreover, the communication unit can comprise further input elements that appear advisable to the person skilled in the art.

The input element can, for example, be arranged within the patient receiving area, e.g. integrated on an enclosure of the patient receiving area opposite a positioning area. With such an arrangement of the input element, data transmission can also take place independently of the adapter apparatus and the patient positioning apparatus. Moreover, it is also conceivable that the input element can also be coupled to the at least one coil plug-in element of the patient positioning apparatus by means of the adapter apparatus.

The adapter apparatus may include an interface adapter apparatus by means of which communication data and/or communication signals can be exchanged by means of the coil plug-in element of the patient positioning apparatus and the communication unit. For instance, the communication unit is releasably connected to the coil plug-in element of the patient positioning apparatus by means of the adapter apparatus. Herein, the adapter apparatus can be specifically embodied to couple the communication unit to the coil plug-in element of the patient positioning apparatus. Moreover, the adapter element can also be included in a magnetic resonance coil, e.g. a local magnetic resonance coil.

The communication interface of the adapter apparatus may include an interface between the patient positioning apparatus, e.g. the coil plug-in element of the patient positioning apparatus, and the communication unit. Herein, the interface can include a mechanical interface for attaching and/or arranging the communication unit. Furthermore, the interface can also include a data interface adapted and/or implemented for data transmission, e.g. communication data transmission, between the communication unit and a further communication element. Herein, the further communication element can include a communication console in a control room. Such a communication console is adapted and/or implemented for communication between the medical operator and the patient. Moreover, the interface can also include a power transmission interface adapted and/or implemented such that the communication unit is supplied with power by means of the patient positioning apparatus and/or via the coil plug-in element of the patient positioning apparatus. Herein, the adapter apparatus can include a first interface element of the communication interface. Moreover, the communication unit can also include a second interface element, wherein the second interface element may be implemented as corresponding to the first interface element.

The disclosure can advantageously provide a simple and inexpensive communication unit for patient communication and/or patient entertainment. Moreover, the coupling to the coil plug-in element of the magnetic resonance apparatus also enables high signal quality of the communication signals and/or communication data to be achieved. Furthermore, an existing data transmission infrastructure for data transmission to a magnetic resonance coil, e.g. a local magnetic resonance coil, can thus also be used for the transmission of communication signals thus saving further components and costs. Thus, it is also possible to dispense with the use of a sound tube for communication signal transmission and/or communication data transmission.

In one advantageous development of the magnetic resonance apparatus according to the disclosure, it can be provided that the adapter apparatus includes a magnetic resonance coil. The magnetic resonance coil of the adapter apparatus may include a local magnetic resonance coil and/or a local radio-frequency coil adapted and/or implemented for the acquisition of magnetic resonance signals during a magnetic resonance examination. For the acquisition of magnetic resonance signals, the local magnetic resonance coils are arranged around an area of the patient to be examined Particularly preferably, the magnetic resonance coil, e.g. the local magnetic resonance coil, includes a magnetic resonance head coil. In this way, a structurally simple coupling and/or arrangement for a communication unit can be achieved on the magnetic resonance coil, e.g. the local magnetic resonance head coil. Herein, e.g. the adapter unit with the communication interface can advantageously be integrated into the local magnetic resonance head coil, thus additionally saving on components and costs. Moreover, in this way a particularly compact integration of the adapter unit can be provided. If the communication unit herein includes an audio cushion, in this way the communication unit, e.g. the audio cushion of the communication unit, can advantageously be integrated into a positioning area of the local magnetic resonance head coil. Moreover, herein, the communication unit can also be arranged in the vicinity of the patient's head, e.g. the patient's ears, thus also ensuring that communication data and/or communication signals can be acquired in a good and effective manner for the patient.

In one advantageous development of the magnetic resonance apparatus according to the disclosure, it can be provided that the communication interface comprises a mechanical interface. The mechanical interface may be implemented to arrange and/or to attach the communication unit on the adapter apparatus, for example on the magnetic resonance coil, e.g. to arrange and/or to attach the communication unit on the adapter apparatus, for example on the magnetic resonance coil, in a releasable manner. Herein, the mechanical interface can include a e.g. releasable latch connection and/or clamp connection between the communication unit and the adapter apparatus. Moreover, the mechanical interface can comprise further releasable form-fit connections and/or force-fit connections between the communication unit and the adapter apparatus. For this purpose, the adapter apparatus, e.g. the local magnetic resonance coil, may include a first mechanical interface element of the mechanical interface. The communication unit may comprise a second mechanical interface element implemented to correspond to and/or complement the first mechanical interface element of the adapter apparatus, e.g. the mechanical interface.

This embodiment of the disclosure enables simple coupling, e.g. a simple arrangement and/or attachment of the communication unit on the adapter apparatus, for example on a local magnetic resonance coil. Moreover, in this way it is also possible for the communication unit to be removed particularly easily from the adapter apparatus, for example for cleaning, and thus also for the coupling, e.g. a mechanical coupling and/or attachment, between the communication unit and the adapter apparatus to be released.

In one advantageous development of the magnetic resonance apparatus according to the disclosure, it can be provided that the communication interface comprises a data interface. The data interface may be adapted and/or implemented to exchange communication data and/or communication signals between the adapter apparatus and the communication unit. For this purpose, the adapter apparatus, e.g. the local magnetic resonance coil, may include a first data interface element of the data interface. The communication unit may comprise a second data interface element implemented to correspond to and/or complement the first data interface element of the adapter apparatus, e.g. the data interface. Herein, a data interface element of the adapter apparatus, e.g. the local magnetic resonance coil, can also be implemented such that the communication data and/or communication signals are merely passed through the adapter apparatus without the data and/or signals, e.g. the communication data and/or communication signals, interacting with the adapter apparatus. The data and/or signals, e.g. the communication data and/or communication signals, are e.g. provided for communication between the patient and a medical operator and/or for patient entertainment.

This embodiment of the disclosure enables particularly direct transmission of data and/or signals, e.g. communication data and/or communication signals. Moreover, this also enables the use of a sound tube for data transmission and/or signal transmission to be dispensed with and thus also enables high signal quality of the data and/or signals transmitted, e.g. the communication data and/or communication signals transmitted, to be achieved for patient communication and/or patient entertainment during a magnetic resonance examination.

In one advantageous development of the magnetic resonance apparatus according to the disclosure, it can be provided that the data interface comprises a plug-in connection. Herein, the adapter apparatus, e.g. the local magnetic resonance coil, may comprise a first data interface element with a plug-in element of the plug-in connection. Moreover, the communication unit can also comprise a second data interface element with a plug-in element of the plug-in connection. The first plug-in element and the second plug-in element may be implemented to complement one another and/or the second plug-in element is embodied as compatible with the first plug-in element so that, when the communication unit is coupled to the adapter unit, e.g. the local magnetic resonance coil, a data connection is established between the communication unit and the adapter unit, e.g. the local magnetic resonance coil, by means of the plug-in connection. Alternatively or additionally, it can also be provided that the data interface is implemented for wireless data transmission. Wireless data transmission can, for example, take place by means of Bluetooth and/or near-field transmission and/or other types of wireless data transmission that appear advisable to the person skilled in the art. In this way, it is possible to achieve particularly simple data transmission between the communication unit and a further unit, e.g. a communication console. Thus, in this way it is possible to dispense with additional cables for data transmission to the communication unit, thus also providing a particularly compact communication interface.

In one advantageous development of the magnetic resonance apparatus according to the disclosure, it can be provided that the communication interface comprises an energy transmission interface. The energy transmission interface may be adapted and/or implemented to transmit energy, e.g. electrical energy to operate the communication apparatus, from the patient positioning apparatus to the communication unit via the adapter apparatus. For this purpose, the adapter apparatus, e.g. the local magnetic resonance coil, preferably includes a first energy transmission interface element of the energy transmission interface. Moreover, the communication unit can also include a second energy transmission interface element embodied to correspond to or complement the first energy transmission interface element of the adapter apparatus, e.g. the energy transmission interface. Herein, the energy transmission interface can include a cabled and/or wired energy transmission interface. Alternatively or additionally, the energy transmission interface can also be implemented for wireless energy transmission to the communication unit, for example, by means of near-field energy transmission. This makes it possible to achieve a particularly compact and lightweight communication unit since additional energy stores, such as, for example, accumulators and/or batteries for operating the communication unit can advantageously be dispensed with. This also facilitates handling and/or use of the communication unit during preparation for a magnetic resonance examination.

In one advantageous development of the magnetic resonance apparatus according to the disclosure, it can be provided that the communication unit includes an audio cushion. The audio cushion may include a cushion into which communication elements of the communication unit are integrated. Such a communication element can be e.g. an output unit for outputting communication signals (e.g. audio communication signals) and/or communication data (e.g. audio communication data), such as, for example, audio transducers, speakers, etc., such as loudspeakers and/or headphones. This embodiment of the disclosure enables a high level of comfort, e.g. a high level of comfort while lying down, for the patient during a magnetic resonance examination. Moreover, the communication unit can be arranged in a particularly compact manner within the magnetic resonance coil system.

In one advantageous development of the magnetic resonance apparatus according to the disclosure, it can be provided that the communication unit includes an output element for outputting communication signals. The output element may be adapted and/or implemented to output acoustic communication data and/or acoustic communication signals and/or audio data, such as, for example, loudspeakers and/or headphones. This enables comfortable communication and/or patient entertainment.

In an alternative embodiment of the communication unit, the communication unit may also include an input element, wherein the input element is adapted and/or implemented to input acoustic communication data and/or acoustic communication signals and/or audio data, such as, for example, a microphone.

BRIEF DESCRIPTION OF THE DRAWINGS/FIGURES

Further advantages, features and details of the disclosure will emerge from the exemplary embodiment described in the following and with reference to the drawings.

Figure 2:
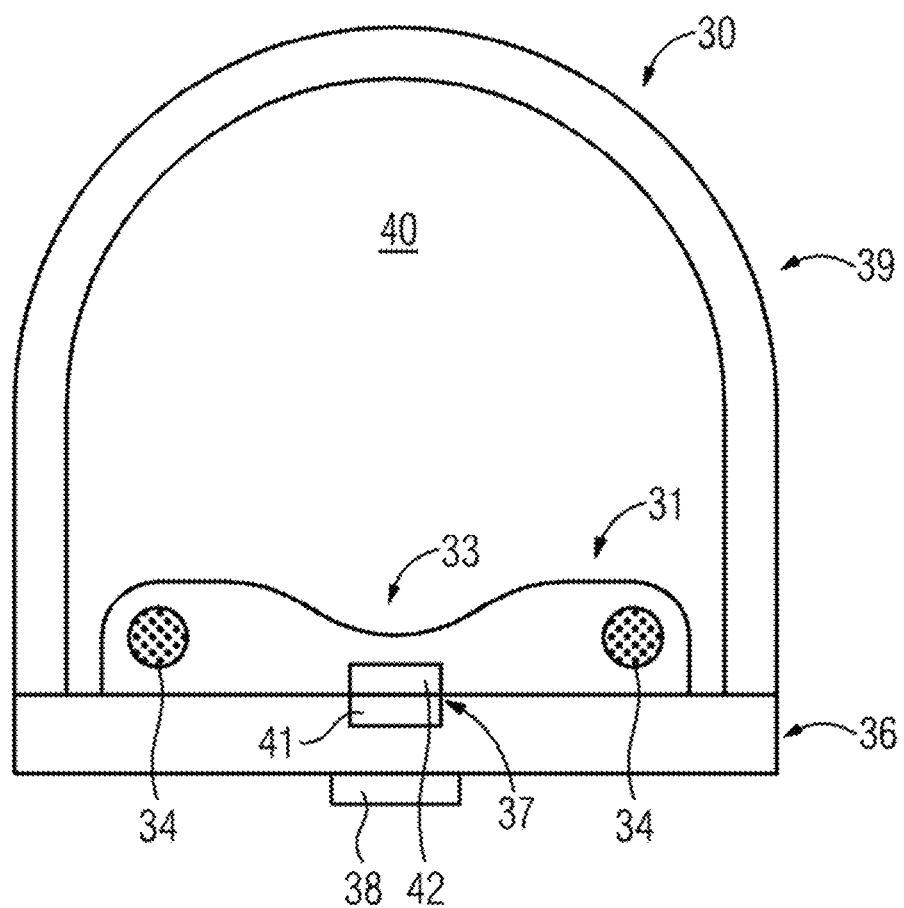

The drawings show:

FIG. 1 illustrates an example magnetic resonance apparatus according to the disclosure with a communication unit and an adapter unit in a schematic depiction; and FIG. 2 illustrates an example communication unit with an adapter unit implemented as a magnetic resonance coil.

DETAILED DESCRIPTION

FIG. 1 is a schematic depiction of a magnetic resonance apparatus 10. The magnetic resonance apparatus 10 includes a scanner unit 11 (e.g. a scanner, scanner circuitry, or an MR scanner) formed by a magnet unit. Moreover, the magnetic resonance apparatus 10 comprises a patient receiving area 12 for receiving a patient 13. In the present exemplary embodiment, the patient receiving area 12 is implemented in a cylinder shape and surrounded by the scanner unit 11, e.g. by the magnet unit, in a circumferential direction. However, in principle, an embodiment of the patient receiving area 12 deviating therefrom is conceivable. The patient 13 can be pushed and/or moved into the patient receiving area 12 by means of a patient positioning apparatus 14 (e.g. a patient positioning system or patient positioning circuitry) of the magnetic resonance apparatus 10. For this purpose, the patient positioning apparatus 14 comprises a patient table 15 implemented as moveable within the patient receiving area 12. For instance, herein the patient table 15 is mounted in a movable manner in the direction of a longitudinal extension of the patient receiving area 12 and/or in the z-direction.

The scanner unit 11, e.g. the magnet unit, includes a superconducting main magnet 16 for generating a strong and constant main magnetic field 17. The scanner unit 11, e.g. the magnet unit, further comprises a gradient coil unit 18 for generating magnetic field gradients which are used for spatial encoding during imaging. The gradient coil unit 18 is controlled by means of a gradient control unit 19 of the magnetic resonance apparatus 10. The scanner unit 11, e.g. the magnet unit, further includes a radio-frequency antenna unit 20 for exciting polarization that is established in the main magnetic field 17 generated by the main magnet 16. The radio-frequency antenna unit 20 is controlled by a radio-frequency antenna control unit 21 of the magnetic resonance apparatus 10 and radiates radio-frequency magnetic resonance sequences into the patient receiving area 12 of the magnetic resonance apparatus 10.

To control the main magnet 16, the gradient control unit 19 and the radio-frequency antenna control unit 21, the magnetic resonance apparatus 10 comprises a system control unit 22. The system control unit 22 controls the magnetic resonance apparatus 10 centrally, such as, for example, for the performance of a predefined imaging gradient echo sequence. Moreover, the system control unit 22 includes an evaluation unit (not shown in further detail) for evaluating medical image data acquired during the magnetic resonance examination.

Furthermore, the magnetic resonance apparatus 10 includes a user interface 23, which is connected to the system control unit 22. Control information such as, for example, imaging parameters and reconstructed magnetic resonance images can be displayed on a display unit 24, for example on at least one monitor of the user interface 23 for a medical operator. The user interface 23 further comprises an input unit 25 by means of which information and/or parameters can be input by the medical operator during a scanning process.

The scanner unit 11 of the magnetic resonance apparatus 10 is arranged together with the patient positioning apparatus 14 within an examination room 26. On the other hand, the system control unit 22 is arranged together with the user interface 23 within a control room 27. The control room 27 is implemented separately from the examination room 26. For instance, the examination room 26 is shielded from the control room 27 with respect to radio-frequency radiation. During a magnetic resonance examination, the patient 13 is located within the examination room 26, whereas the medical operator is located within the control room 27.

In order to enable communication between the patient 13 and the medical operator during the magnetic resonance examination, the magnetic resonance apparatus 10 comprises a communication apparatus 30 (e.g. a communication system). The communication apparatus 30 includes a communication unit 31 (e.g. communication circuitry) arranged within the examination room 26. Herein, the communication unit 31 is available to the patient 13 during the magnetic resonance examination for communication with the medical operator. Furthermore, the communication unit 31 is also available to the patient 13 for patient entertainment, for example for listening to and/or playing music.

The communication apparatus 30 furthermore comprises a communication console 32. The communication console 32 is arranged within the control room 27 and is available to the medical operator during the magnetic resonance examination for communication with the patient 13. For an exchange of communication signals and/or communication data, the communication apparatus 30 comprises a communication data transmission unit 43 (e.g. communication data transmission circuitry) that exchanges the communication signals and/or communication data between the communication console 32 within the control room 27 and the communication unit 31 within the examination room 26.

Herein, the communication signals and/or the communication data can include signals and/or data that are exchanged during communication between the patient 13 and the medical operator. Furthermore, the communication signals and/or communication data can also include signals and/or data for patient entertainment during the magnetic resonance examination of the patient 13. For example, herein a file containing a selection of pieces of music can be stored by the communication console 32. For this purpose, the communication console 32 can also include a memory unit (e.g. any suitable type of memory, storage, etc. not shown in further detail). For instance, the communication signals and/or the communication data may include acoustic communication signals and/or acoustic communication data and/or audio data.

In the present exemplary embodiment, the communication unit 31 includes an audio cushion 33. The audio cushion 33 includes a positioning area for positioning e.g. the head of the patient 13. The communication unit 31, e.g. the audio cushion 33, includes at least one output element 34 for outputting communication signals and/or communication data, e.g. audible signals such as audible sounds, which may include acoustic communication signals and/or acoustic communication data and/or audio data. The output element 34 can, for example, include headphones and/or loudspeakers. In the present exemplary embodiment, the communication unit 31, e.g. the audio cushion 33, includes two output elements 34, e.g. two acoustic output elements 34. Here, in each case one of the output elements 34 is arranged on a side next to the positioning area of the audio cushion 33 so that the two output elements 34 are arranged on opposite sides next to the positioning area of the audio cushion 33.

The two output elements 34 are integrated within the audio cushion 33. Here, the two output elements 34 may be integrated within the audio cushion 33 in such a way that the comfort of the patient 13 while in a lying position on the cushion, e.g. the audio cushion 33, is not impaired. Moreover, the audio cushion 33 is implemented as magnetic resonance compatible thus preventing any impairment of the magnetic resonance imaging.

The communication apparatus 30 furthermore also includes at least one input element 35 for inputting communication signals and/or communication data, e.g. acoustic communication signals and/or acoustic communication data, such as, for example, a microphone. In the present exemplary embodiment, the at least one input element 35, e.g. the microphone, is arranged on a wall of the patient receiving area 12 opposite a positioning area for the head of the patient 13 so that advantageous acquisition of communication data and/or communication signals of the patient 13 can be ensured. In an alternative embodiment of the disclosure, it can also be provided that the communication unit 31, e.g. the audio cushion 33, includes the at least one input element 35.

For an arrangement of the communication unit 31, e.g. the audio cushion 33, in a positioning area of the patient positioning apparatus 14, the magnetic resonance apparatus 10 comprises an adapter apparatus 36 (e.g. an adapter). The adapter apparatus 36 includes a communication interface 37. The adapter apparatus 36, e.g. the communication interface 37, is used to couple the communication unit 31, e.g. the audio cushion 33, to the patient positioning apparatus 14.

The patient positioning apparatus 14 comprises at least one coil plug-in element 38. The at least one coil plug-in element 38 is, for example, implemented as a plug socket and arranged on the patient positioning apparatus 14. The at least one coil plug-in element 38 can be used to couple a magnetic resonance coil 39, e.g. a local magnetic resonance coil 39, for data transmission to an evaluation unit and/or a control unit.

The adapter apparatus 36, together with the communication interface 37, is implemented to couple the communication unit 31, e.g. the audio cushion 33, to the coil plug-in element 38 of the patient positioning apparatus 14. Herein, the adapter apparatus 36 can include a separately embodied adapter apparatus 36, which is herein specifically implemented to couple the communication unit 31 to the coil plug-in element 38 of the patient positioning apparatus 14. Moreover, the adapter apparatus 36 can also include a magnetic resonance coil 39, e.g. a local magnetic resonance coil 39.

The adapter apparatus 36 and the communication interface 37 enable an infrastructure, e.g. the coil plug-in element 38, wherein the infrastructure is adapted or implemented for data exchange with a magnetic resonance coil 39, e.g. a local magnetic resonance coil 39, to be used for data exchange and/or for a power supply for the communication unit 31.

In the present exemplary embodiment, the adapter apparatus 36 includes the magnetic resonance coil 39. The magnetic resonance coil 39, e.g. the local magnetic resonance coil 39, is implemented to acquire magnetic resonance data during a magnetic resonance examination and, for this purpose, is arranged around the area of the patient to be examined 13. In the present exemplary embodiment, the local magnetic resonance coil 39 is formed by a local magnetic resonance head coil that includes a receiving area 40 for positioning the head of the patient 13. Moreover, the magnetic resonance coil 39 can be formed by further local magnetic resonance coils 39 that appear advisable to the person skilled in the art, such as, for example, a local magnetic resonance neck coil, etc.

Here, the communication unit 31, e.g. the audio cushion 33, is arranged within the receiving area 40 of the local magnetic resonance coil 31, e.g. the local magnetic resonance head coil for receiving the area of the patient 13 to be examined. For instance, the communication unit 31, e.g. the audio cushion 33, is arranged in a positioning area of the local magnetic resonance head coil for positioning the head of the patient.

The communication interface 37 comprises at least one first interface element 41, which is included in the local magnetic resonance coil 39, e.g. the local magnetic resonance head coil. The first interface element 41 of the local magnetic resonance coil 39, e.g. the local magnetic resonance head coil, may be arranged in the positioning area of the local magnetic resonance coil 39, e.g. the local magnetic resonance head coil. Furthermore, the communication unit 31 also comprises an interface element 42 formed by a second interface element 42. The second interface element 42 of the communication unit 31 may be arranged on a side of the audio cushion 33 facing a lying surface of the audio cushion 33. Here, e.g. the first interface element 41 of the communication interface 37 and the second interface element 42 of the communication unit are implemented to be compatible and/or to correspond to one another.

The communication interface 37 comprises a mechanical interface for arranging and/or attaching the communication unit 31, e.g. the audio cushion 33, to the local magnetic resonance coil 39, e.g. the local magnetic resonance head coil. Herein, the mechanical interface can for example include a latch connection and/or a clamp connection between the local magnetic resonance coil 39, e.g. the local magnetic resonance head coil, and the communication unit 31, e.g. the audio cushion 33. Moreover, further mechanical connections between the local magnetic resonance coil 39, e.g. the local magnetic resonance head coil, and the communication unit 31, e.g. the audio cushion 33, are conceivable.

Here, the first interface element 41 of the local magnetic resonance coil 39, e.g. the local magnetic resonance head coil, may comprise a first mechanical interface element. Moreover, the second interface element 42 of the communication unit 31, e.g. the audio cushion 33, may also comprise a second mechanical interface element. For instance, the first mechanical interface element and the second mechanical interface element may be implemented as complementary to one another and/or the second mechanical interface element may be implemented as compatible with the first mechanical interface element. As an example, the communication unit 31, e.g. the audio cushion 33, is connected releasably to the coil plug-in element 38 of the patient positioning apparatus 14 by means of the adapter apparatus 36, e.g. the mechanical interface.

The communication interface 37 further comprises a data interface for exchanging and/or transmitting data and/or signals, e.g. communication data and/or communication signals, between the local magnetic resonance coil 39, e.g. the local magnetic resonance head coil, and the communication unit 31, e.g. the audio cushion 33. Here, the first interface element 41 of the local magnetic resonance coil 39, e.g. the local magnetic resonance head coil, may comprise a first data interface element. Moreover, the second interface element 42 of the communication unit 31, e.g. the audio cushion 33, may further comprise a second data interface element.

Herein, the data interface can include a plug-in connection for exchanging and/or transmitting data and/or signals, e.g. communication data and/or communication signals, between the local magnetic resonance coil 39, e.g. the local magnetic resonance head coil, and the communication unit 31, e.g. the audio cushion 33. For instance, here, the local magnetic resonance coil 39, e.g. the local magnetic resonance head coil, comprises a first plug-in element and the communication unit 31, e.g. the audio cushion 33, comprises a second plug-in element of the plug-in connection. Here, e.g. the first plug-in element and the second plug-in element are implemented as complementary to one another and/or the second plug-in element is implemented as compatible with the first plug-in element.

Alternatively or additionally, it can also be the case that the data interface is implemented for wireless data transmission. Wireless data transmission can, for example, take place between the local magnetic resonance coil 39, e.g. the local magnetic resonance head coil, and the communication unit 31, e.g. the audio cushion 33, by means of Bluetooth and/or near-field transmission and/or further types of wireless data transmission that appear advisable to the person skilled in the art. Here, the first data interface element of the local magnetic resonance coil 39, e.g. the local magnetic resonance head coil, is implemented for wireless data transmission with the second data interface element of the communication unit 31, e.g. the audio cushion 33.

The communication interface 37 further comprises an energy transmission interface for a power supply for the communication unit 31, e.g. the audio cushion 33, via the local magnetic resonance coil 39, e.g. the local magnetic resonance head coil. Here, the first interface element 41 of the local magnetic resonance coil 39, e.g. the local magnetic resonance head coil, may comprise a first energy transmission interface element. Moreover, the second interface element 42 of the communication unit 31, e.g. the audio cushion 33, may comprise a second energy transmission interface element. Herein, the energy transmission interface can include a cabled and/or wired energy transmission interface. Alternatively or additionally, the energy transmission interface can also be embodied for wireless energy transmission to the communication unit 31, such as, for example, near-field energy transmission.

The adapter apparatus 36 and/or the communication interface 37 advantageously enables an existing data transmission infrastructure for data transmission of data and/or signals from the magnetic resonance coil 39, e.g. the local magnetic resonance head coil, to be used for transmission of communication signals from the communication unit 31, e.g. the audio cushion 33.

The magnetic resonance apparatus 10 depicted can obviously include further components usually comprised by magnetic resonance apparatuses 10. Moreover, the general mode of operation of a magnetic resonance apparatus 10 is known to the person skilled in the art so that no more detailed description of the further components will be given.

Although the disclosure has been illustrated and described in further detail by the exemplary embodiments, the disclosure is not restricted by the disclosed examples, and other variations can be derived by a person skilled in the art without leaving the scope of protection of the disclosure.

What is claimed is:

1. A magnetic resonance (MR) apparatus, comprising:
a patient receiving area configured to receive a patient for a magnetic resonance examination;
a patient positioning system configured to move the patient into the patient receiving area, the patient positioning system including at least one coil plug-in element and communication component; and
an adapter comprising a MR head coil and a communication interface, the adapter being configured to couple the communication component to the at least one coil plug-in element of the patient positioning system via the communication interface,
wherein the communication component comprises a cushion that is integrated into a positioning area of the MR head coil that is configured to receive the head of a patient, and
wherein the cushion of the communication component is configured to output audible sound based upon communication data that is received via the communication interface.

2. The MR apparatus as claimed in claim 1, wherein the communication interface comprises a mechanical interface.

3. The MR apparatus as claimed in claim 1, wherein the communication interface comprises a data interface.

4. The MR apparatus as claimed in claim 3, wherein the data interface comprises a plug-in connection.

5. The MR apparatus as claimed in claim 3, wherein the data interface is configured for wireless data transmission.

6. The MR apparatus as claimed in claim 1, wherein the communication interface comprises an energy transmission interface.

7. The MR apparatus as claimed in claim 1, wherein the communication component comprises an output element configured to output the audible sound.

8. The MR apparatus as claimed in claim 1, wherein the communication component is configured to exchange, via the coil plug-in element of the patient positioning system, the communication data between the adapter and a communication console that is remote to the MR apparatus.

9. The MR apparatus as claimed in claim 1, wherein the communication interface further comprises a power transmission interface configured to provide the communication component with power via the coil plug-in element of the patient positioning system.

10. A communication apparatus, comprising:
a communication component; and
an adapter comprising a MR head coil and a communication interface, the adapter being configured to couple the communication component to at least one coil plug-in element of a patient positioning system via the communication interface,
wherein the patient positioning system is configured to move a patient into a patient receiving area for a magnetic resonance (MR) examination,
wherein the communication component comprises a cushion that is integrated into a positioning area of the MR head coil that is configured to receive the head of a patient, and
wherein the cushion of the communication component is configured to output audible sound based upon communication data that is received via the communication interface.

11. The communication apparatus as claimed in claim 10, wherein the communication interface comprises a mechanical interface.

12. The communication apparatus as claimed in claim 10, wherein the communication interface comprises a data interface.

13. The communication apparatus as claimed in claim 12, wherein the data interface comprises a plug-in connection.

14. The communication apparatus as claimed in claim 12, wherein the data interface is configured for wireless data transmission.

15. The communication apparatus as claimed in claim 10, wherein the communication interface comprises an energy transmission interface.

16. The communication apparatus as claimed in claim 10, wherein the communication component comprises an output element configured to output the audible sound.

17. The communication apparatus as claimed in claim 10, wherein the communication component is configured to exchange, via the coil plug-in element of the patient positioning system, the communication data between the adapter and a communication console that is remote to the communication apparatus.

18. The communication apparatus as claimed in claim 10, wherein the communication interface further comprises a power transmission interface configured to provide the communication component with power via the coil plug-in element of the patient positioning system.

* * * * *